(12) United States Patent
Hanashima et al.

(10) Patent No.: US 12,351,908 B2
(45) Date of Patent: Jul. 8, 2025

(54) SUBSTRATE PROCESSING METHOD, RECORDING MEDIUM, AND SUBSTRATE PROCESSING APPARATUS

(71) Applicant: Kokusai Electric Corporation, Tokyo (JP)

(72) Inventors: Takeo Hanashima, Toyama (JP); Kazuhiro Harada, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 650 days.

(21) Appl. No.: 17/535,793

(22) Filed: Nov. 26, 2021

(65) Prior Publication Data

US 2022/0170154 A1 Jun. 2, 2022

(30) Foreign Application Priority Data

Nov. 27, 2020 (JP) ................................ 2020-196816

(51) Int. Cl.
*C23C 16/455* (2006.01)
*C23C 16/34* (2006.01)
(Continued)

(52) U.S. Cl.
CPC ...... *C23C 16/45525* (2013.01); *C23C 16/345* (2013.01); *C23C 16/52* (2013.01); *H01L 21/02211* (2013.01); *H01L 21/0228* (2013.01)

(58) Field of Classification Search
CPC . C23C 16/45525; C23C 16/345; C23C 16/52; C23C 16/045; C23C 16/4408;
(Continued)

(56) References Cited

U.S. PATENT DOCUMENTS 7,485,338 B2\* 2/2009 Faguet ............. C23C 16/45525
700/123
8,017,182 B2\* 9/2011 Hendriks ............. C23C 16/401
427/255.394
(Continued)

FOREIGN PATENT DOCUMENTS

JP 2010-090413 A 4/2010
JP 2012-175057 A 9/2012
(Continued)

OTHER PUBLICATIONS

Korean Office Action issued Sep. 21, 2023 for Korean Patent Application No. 10-2021-0165979.
(Continued)

*Primary Examiner* — Jay C Kim
(74) *Attorney, Agent, or Firm* — Volpe Koenig (57) ABSTRACT

There is provided a technique that includes forming a film on a substrate by performing a cycle a predetermined number of times, the cycle including: (a) supplying a precursor gas from a precursor gas supply line into a process chamber in which the substrate is accommodated; and (b) supplying a reaction gas into the process chamber in which the substrate is accommodated, wherein in (a), the precursor gas is divisionally supplied to the substrate a first plural number of times, the precursor gas is pre-filled in a storage installed in the precursor gas supply line and then supplied into the process chamber when the precursor gas is supplied for the first time, and an inside of the process chamber is exhausted before supplying the precursor gas for the second time.

20 Claims, 5 Drawing Sheets

(51) Int. Cl.
*C23C 16/52* (2006.01)
*H01L 21/02* (2006.01)

(58) Field of Classification Search
CPC ........ C23C 16/45527; C23C 16/45544; C23C 16/45553; C23C 16/45561; C23C 16/45578; C23C 16/36; C23C 16/4412; C23C 16/34; C23C 16/45557; C23C 16/45576; H01L 21/02211; H01L 21/0228; H01L 21/67103; H01L 21/02167; H01L 21/0217; H01L 21/02126
See application file for complete search history.

(56) References Cited

U.S. PATENT DOCUMENTS

| | | | | |
|---|---|---|---|---|
| 8,025,931 | B2 * | 9/2011 | Chou | C23C 16/345 |
| | | | | 118/723 R |
| 8,026,159 | B2 * | 9/2011 | Horii | C23C 16/4401 |
| | | | | 118/723 VE |
| 8,080,109 | B2 * | 12/2011 | Okada | B08B 5/00 |
| | | | | 134/1.1 |
| 8,178,448 | B2 * | 5/2012 | Nodera | C23C 16/45542 |
| | | | | 438/791 |
| 8,646,407 | B2 * | 2/2014 | Matsuura | C23C 16/45546 |
| | | | | 118/724 |
| 9,478,413 | B2 * | 10/2016 | Shimamoto | C23C 16/36 |
| 9,508,555 | B2 | 11/2016 | Kaga et al. | |
| 9,865,451 | B2 * | 1/2018 | Noda | H01L 21/02049 |
| 9,916,976 | B2 * | 3/2018 | Ushida | H01L 21/0228 |
| 9,920,424 | B2 * | 3/2018 | Goto | H01L 21/02041 |
| 10,297,440 | B2 * | 5/2019 | Yamazaki | H01L 21/0228 |
| 10,707,074 | B2 * | 7/2020 | Nagatomi | C23C 16/4412 |
| 11,555,246 | B2 * | 1/2023 | Shimada | C23C 16/45578 |
| 11,786,946 | B2 * | 10/2023 | Son | C23C 16/45561 |
| | | | | 134/21 |
| 2006/0213539 | A1 * | 9/2006 | Hasebe | C23C 16/4404 |
| | | | | 427/535 |
| 2010/0136260 | A1 | 6/2010 | Matsunaga et al. | |
| 2011/0104896 | A1 * | 5/2011 | Harada | C23C 16/06 |
| | | | | 118/725 |
| 2012/0269969 | A1 | 10/2012 | Suzuki et al. | |
| 2013/0149873 | A1 * | 6/2013 | Hirose | C23C 16/45523 |
| | | | | 438/763 |
| 2013/0171838 | A1 | 7/2013 | Okuda | |
| 2013/0323935 | A1 | 12/2013 | Suzuki et al. | |
| 2014/0106577 | A1 | 4/2014 | Tonegawa et al. | |
| 2014/0213069 | A1 | 7/2014 | Takebayashi et al. | |
| 2014/0295082 | A1 | 10/2014 | Motoyama et al. | |
| 2014/0295667 | A1 | 10/2014 | Kaga et al. | |
| 2014/0356550 | A1 | 12/2014 | Tonegawa et al. | |
| 2015/0031216 | A1 * | 1/2015 | Akae | C23C 16/345 |
| | | | | 118/704 |
| 2016/0093476 | A1 | 3/2016 | Toyoda et al. | |
| 2016/0358767 | A1 | 12/2016 | Nitta et al. | |
| 2017/0051408 | A1 | 2/2017 | Takagi et al. | |
| 2019/0093222 | A1 | 3/2019 | Okuda et al. | |

FOREIGN PATENT DOCUMENTS

| | | |
|---|---|---|
| JP | 2013093551 A | 5/2013 |
| JP | 2014007378 A | 1/2014 |
| JP | 2014-082322 A | 5/2014 |
| JP | 2014-175509 A | 9/2014 |
| JP | 2014168046 A | 9/2014 |
| JP | 2014-199856 A | 10/2014 |
| JP | 2014-208883 A | 11/2014 |
| JP | 2014-236069 A | 12/2014 |
| JP | 2017-005016 A | 1/2017 |
| JP | 2019-067820 A | 4/2019 |
| KR | 20170009725 A | 1/2017 |

OTHER PUBLICATIONS

Taiwan Office Action issued on Jul. 28, 2022 for Taiwan Patent Application No. 110143496.
Japanese Office Action issued on Sep. 13, 2022 for Japanese Patent Application No. 2020-196816.
Singapore Search Report issued on Apr. 25, 2023 for Singapore Patent Application No. 10202113203Y.
Singapore Written Opinion issued on Apr. 25, 2023 for Singapore Patent Application No. 10202113203Y.

* cited by examiner

SUBSTRATE PROCESSING METHOD, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2020-196816, filed on Nov. 27, 2020, the entire contents of which are incorporated herein by reference.

TECHNICAL FIELD

The present disclosure relates to a substrate processing method, a recording medium, and a substrate processing apparatus.

BACKGROUND

In the related art, as a process for manufacturing a semiconductor device, there may be performed a substrate processing process in which a precursor gas or a reaction gas is supplied to a substrate to form a film on the substrate.

SUMMARY

Some embodiments of the present disclosure provide a technique capable of improving the step coverage or the in-plane film thickness uniformity of a film formed on a substrate.

According to one embodiment of the present disclosure, there is provided a technique that includes forming a film on a substrate by performing a cycle a predetermined number of times, the cycle including: (a) supplying a precursor gas from a precursor gas supply line into a process chamber in which the substrate is accommodated; and (b) supplying a reaction gas into the process chamber, wherein in (a), the precursor gas is divisionally supplied to the substrate a first plural number of times, the precursor gas is pre-filled in a storage installed in the precursor gas supply line and then supplied into the process chamber when the precursor gas is supplied for the first time, and an inside of the process chamber is exhausted before supplying the precursor gas for the second time.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

Hereinafter, one embodiment of the present disclosure will be described mainly with reference to FIGS. 1 to 4. The drawings used in the following description are all schematic. The dimensional relationship of each element on the drawings, the ratio of each element, and the like may not always match the actual ones. Further, even between the drawings, the dimensional relationship of each element, the ratio of each element, and the like may not always match.

(1) Configuration of Substrate Processing Apparatus

Figure 1:
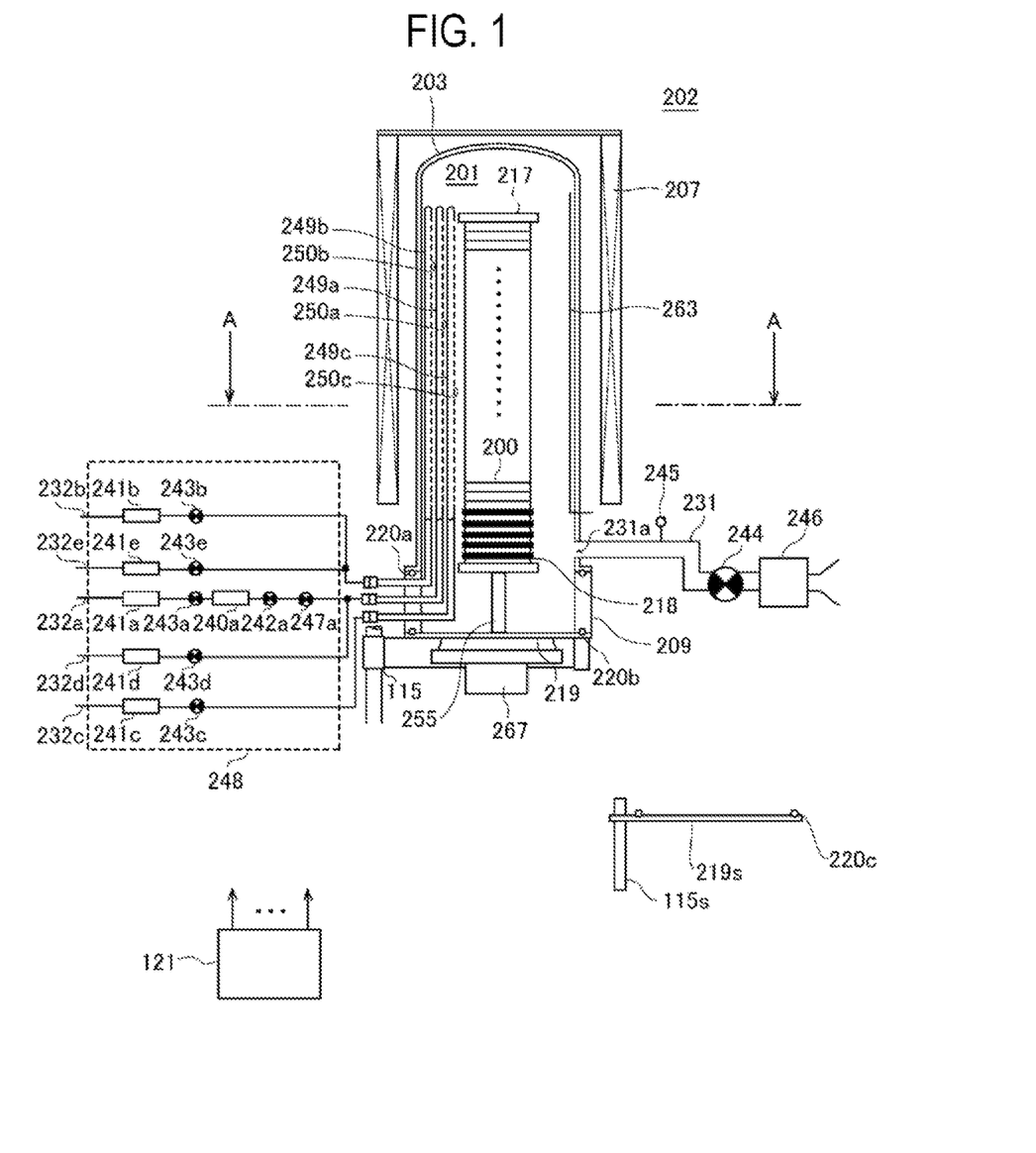
FIG. 1 is a schematic configuration diagram of a vertical process furnace of a substrate processing apparatus suitably used in one embodiment of the present disclosure, in which the portion of the process furnace 202 is illustrated in a vertical sectional view.

As shown in FIG. 1, a process furnace 202 includes a heater 207 as a temperature regulator (heating part). The heater 207 has a cylindrical shape and is vertically installed by being supported by a holder. The heater 207 also functions as an activation mechanism (excitation part) that activates (excites) a gas with heat.

Inside the heater 207, a reaction tube 203 is arranged concentrically with the heater 207. The reaction tube 203 is made of a heat-resistant material such as, for example, quartz ($SiO_2$) or silicon carbide (SiC) or the like, and is formed in a cylindrical shape with an upper end thereof closed and a lower end thereof opened. Below the reaction tube 203, a manifold 209 is arranged concentrically with the reaction tube 203. The manifold 209 is made of a metallic material such as stainless steel (SUS) or the like, and is formed in a cylindrical shape with upper and lower ends thereof opened. The upper end of the manifold 209 is engaged with the lower end of the reaction tube 203 and is configured to support the reaction tube 203. An O-ring 220a as a seal member is provided between the manifold 209 and the reaction tube 203. The reaction tube 203 is installed vertically similar to the heater 207. A process container (reaction container) is mainly composed of the reaction tube 203 and the manifold 209. A process chamber 201 is formed in the hollow portion of the process container. The process chamber 201 is configured to accommodate wafers 200 as substrates. The wafers 200 are processed in the process chamber 201.

Nozzles 249a to 249c as first to third supply parts are provided in the process chamber 201 so as to penetrate the side wall of the manifold 209. The nozzles 249a to 249c are also referred to as first to third nozzles, respectively. The nozzles 249a to 249c are made of, for example, a heat-resistant material such as quartz or SiC. Gas supply pipes 232a to 232c are connected to the nozzles 249a to 249c, respectively. The nozzles 249a to 249c are different nozzles, and the nozzles 249b and 249c are provided adjacent to the nozzle 249a.

In the gas supply pipe 232a, a mass flow controller (MFC) 241a, which is a flow rate controller (flow rate control part), a valve 243a as a first valve, which is an opening/closing valve, a storage (gas reservoir) 240a configured to temporarily store a gas, a valve 242a as a second valve and a valve 247a as a third valve are provided sequentially from the upstream side of a gas flow. A gas supply pipe 232d is connected to the gas supply pipe 232a on the downstream side of the valve 247a. In the gas supply pipe 232d, an MFC 241d and a valve 243d are provided sequentially from the upstream side of a gas flow. The gas supply pipes 232a and 232d and the storage 240a are made of a metallic material such as stainless steel or the like.

The storage 240a is configured as, for example, a gas tank or a spiral pipe having a gas capacity larger than that of an ordinary pipe. By opening and closing the valve 243a on the upstream side of the storage 240a and the valve 242a on the downstream side of the storage 240a, it is possible to perform filling the storage 240a with the gas supplied from the gas supply pipe 232a and supplying the gas filled in the storage 240a into the process chamber 201. The conductance between the storage 240a and the process chamber 201 may be set to be, for example, $1.5 \times 10^{-3}$ m$^3$/s or more. Further, considering the ratio of a volume of the storage 240a to a volume of the process chamber 201, when the volume of the process chamber 201 is 100 L (liter), the volume of the storage 240a may be set to, for example, 100 to 300 cc, or $1/1000$ to $3/1000$ times of the volume of the process chamber 201.

By closing the valves 242a and 247a and opening the valve 243a, the gas whose flow rate is adjusted by the MFC 241a can be filled in the storage 240a. When a predetermined amount of gas is filled in the storage 240a and the pressure in the storage 240a reaches a predetermined pressure, by closing the valve 243a and opening the valves 242a and 247a, a high-pressure gas filled in the storage 240a can be supplied (flash-supplied) into the process chamber 201 at once (in a short time) via the gas supply pipe 232a and the nozzle 249a. The valve 243a may be opened during flash supply.

In the gas supply pipes 232b and 232c, MFCs 241b and 241c and valves 243b and 243c, which are opening/closing valves, are installed sequentially from the upstream side of a gas flow. A gas supply pipe 232e is connected to the gas supply pipe 232b on the downstream side of the valve 243b. An MFC 241e and a valve 243e are provided in the gas supply pipe 232e sequentially from the upstream side of the gas flow. The gas supply pipes 232b, 232c and 232e are made of a metallic material such as stainless steel or the like.

Figure 2:
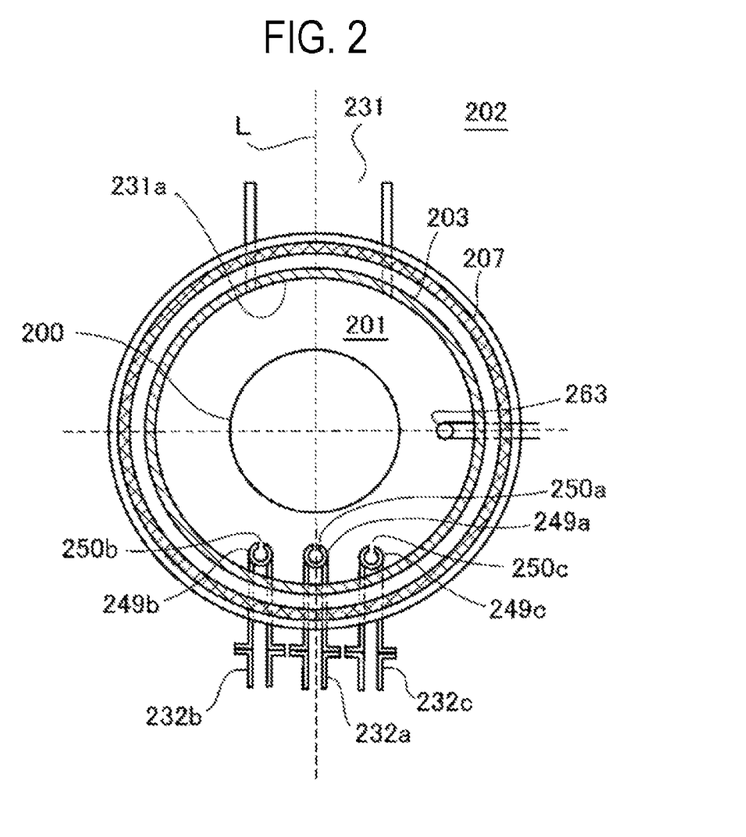
FIG. 2 is a schematic configuration diagram of the vertical process furnace of the substrate processing apparatus suitably used in one embodiment of the present disclosure, in which the portion of the process furnace 202 is illustrated in a sectional view taken along a line A-A in FIG. 1.

As shown in FIG. 2, the nozzles 249a to 249c are provided in a space having an annular shape in a plan view between an inner wall of the reaction tube 203 and the wafers 200 such that the nozzles 249a to 249c extend upward along an arrangement direction of the wafers 200 from a lower portion to an upper portion of the inner wall of the reaction tube 203. In other words, the nozzles 249a to 249c are respectively installed in a region horizontally surrounding a wafer arrangement region in which the wafers 200 are arranged, at a lateral side of the wafer arrangement region so as to extend along the wafer arrangement region. In a plan view, the nozzle 249a is disposed to face an exhaust port 231a to be described below, on a straight line across the centers of the wafers 200 loaded into the process chamber 201. The nozzles 249b and 249c are arranged so as to sandwich a straight line L passing through the nozzle 249a and the center of the exhaust port 231a from both sides along the inner wall of the reaction tube 203 (the outer peripheral portions of the wafers 200). The straight line L is a straight line passing through the nozzle 249a and the center of the wafers 200. The nozzle 249c may installed on the side opposite to the nozzle 249b with the straight line L interposed therebetween. The nozzles 249b and 249c are disposed line-symmetrically with the straight line L as an axis of symmetry. Gas supply holes 250a to 250c for supplying gases are provided on a side surfaces of the nozzles 249a to 249c, respectively. The gas supply holes 250a to 250c are respectively opened to face the exhaust port 231a in a plan view and can supply gases toward the wafers 200. The plurality of gas supply holes 250a to 250c is provided from the lower portion to the upper portion of the reaction tube 203.

From the gas supply pipe 232a, a precursor gas is supplied into the process chamber 201 via the MFC 241a, the valve 243a, the storage 240a, the valves 242a and 247a and the nozzle 249a.

From the gas supply pipe 232b, a reaction gas is supplied into the process chamber 201 via the MFC 241b, the valve 243b and the nozzle 249b. The reaction gas is a substance having a molecular structure (chemical structure) different from that of the precursor gas.

From the gas supply pipes 232d and 232e, an inert gas is supplied into the process chamber 201 via the MFCs 241d and 241e, the valves 243d and 243e, the gas supply pipes 232a and 232b, and the nozzles 249a and 249b, respectively. Further, from the gas supply pipe 232c, an inert gas is supplied into the process chamber 201 via the MFC 241c, the valve 243c and the nozzle 249c. The inert gas acts as a purge gas, a carrier gas, a diluting gas and the like.

A precursor gas supply system (precursor gas supply line) is mainly composed of the gas supply pipe 232a, the MFC 241a, the valves 243a, 242a and 247a, and the storage 240a. A reaction gas supply system (reaction gas supply line) is mainly composed of the gas supply pipe 232b, the MFC 241b and the valve 243b. An inert gas supply system (inert gas supply line) is mainly composed of the gas supply pipes 232c to 232e, the MFCs 241c to 241e and the valves 243c to 243e. The precursor gas supply line may not be provided with the valve 247a.

Each or both of the precursor gas and the reaction gas is also referred to as a film-forming gas, and each or both of the precursor gas supply system and the reaction gas supply system is also referred to as a film-forming gas supply system (film-forming gas supply line).

Some or all of the above-described various gas supply systems may be configured as an integrated gas supply system 248 in which the valves 243a, 242a, 247a and 243b to 243e, the storage 240a, the MFCs 241a to 241e and the like are integrated. The integrated gas supply system 248 is configured to be connected to each of the gas supply pipes 232a to 232e such that the acts of supplying of various gases into the gas supply pipes 232a to 232e, i.e., the acts of opening or closing of the valves 243a, 242a, 247a and 243b to 243e, the acts of flow rate adjusting by the MFCs 241a to 241e, and the like are controlled by the controller 121 which will be described later. The integrated gas supply system 248 is composed of integral type or a division type integrated units and may be attached to or detached from the gas supply pipes 232a to 232e and the like on the integrated unit basis. The integrated gas supply system 248 is configured to perform the maintenance, replacement, expansion, or the like on the integrated unit basis.

An exhaust port 231a for exhausting the atmosphere in the process chamber 201 is provided in the lower portion of a side wall of the reaction tube 203. As shown in FIG. 2, the exhaust port 231a is provided at a position facing the nozzles 249a to 249c (gas supply holes 250a to 250c) with the wafers 200 interposed therebetween in a plan view. The exhaust port 231a may be provided to extend from the lower portion to the upper portion of the side wall of the reaction tube 203, i.e., along the wafer arrangement region. An exhaust pipe 231 is connected to the exhaust port 231a. The exhaust pipe 231 is made of a metallic material such as stainless steel or the like. A vacuum pump 246 as a vacuum exhauster is connected to the exhaust pipe 231 via a pressure sensor 245 as a pressure detector (pressure detection part) for detecting the pressure inside the process chamber 201 and an APC (Auto Pressure Controller) valve 244 as a pressure regulator (pressure regulation part). The APC valve 244 is configured to be capable of performing or stopping vacuum exhausting of an interior of the process chamber 201 by opening or closing the valve in a state in which the vacuum pump 246 is operated. Furthermore, in a state in which the vacuum pump 246 is operated, the APC valve 244 is configured to be capable of regulating the pressure inside the process chamber 201 by adjusting a valve opening degree based on a pressure information detected by the pressure sensor 245. An exhaust system is mainly composed of the exhaust pipe 231, the APC valve 244 and the pressure sensor 245. The vacuum pump 246 may be included in the exhaust system.

A seal cap 219 as a furnace opening lid capable of air-tightly closing a lower end opening of the manifold 209 is installed below the reaction tube 203. The seal cap 219 is made of a metallic material such as, for example, stainless steel or the like, and is formed in a disc shape. On the upper surface of the seal cap 219, an O-ring 220b as a seal in contact with a lower end of the manifold 209 is installed. Below the seal cap 219, a rotator 267 for rotating a boat 217 to be described later is installed. A rotating shaft 255 of the rotator 267 is made of, for example, a metallic material such as stainless steel or the like and is connected to the boat 217 through the seal cap 219. The rotator 267 is configured to rotate the wafers 200 by rotating the boat 217. The seal cap 219 is configured to be raised or lowered in the vertical direction by a boat elevator 115 as an elevator installed outside the reaction tube 203. The boat elevator 115 is configured as a transfer device (transfer mechanism) that loads or unloads (transfers) the wafers 200 into and out of the process chamber 201 by raising or lowering the seal cap 219.

Below the manifold 209, a shutter 219s is installed as a furnace opening lid capable of air-tightly closing the lower end opening of the manifold 209 in a state in which the seal cap 219 is lowered and the boat 217 is unloaded from the process chamber 201. The shutter 219s is made of a metallic material such as stainless steel or the like and is formed in a disk shape. On the upper surface of the shutter 219s, an O-ring 220c as a seal in contact with the lower end of the manifold 209 is installed. The opening/closing operations (the elevating operation, the rotating operation, or the like) of the shutter 219s are controlled by a shutter opener/closer 115s.

A boat 217 as a substrate support is configured to support a plurality of wafers 200, for example, 25 to 200 wafers 200 in such a state that the wafers 200 are arranged in a horizontal posture and in multiple stages along a vertical direction with the centers of the wafers 200 aligned with each other, i.e., so as to arrange the wafers 200 at intervals. The boat 217 is made of a heat-resistant material such as, for example, quartz or SiC. Heat insulating plates 218 made of a heat-resistant material such as, for example, quartz or SiC, are supported in multiple stages at the bottom of the boat 217.

Inside the reaction tube 203, there is installed a temperature sensor 263 as a temperature detector. By adjusting a degree of conducting electricity to the heater 207 based on a temperature information detected by the temperature sensor 263, the temperature inside the process chamber 201 becomes a desired temperature distribution. The temperature sensor 263 is installed along the inner wall of the reaction tube 203.

Figure 3:
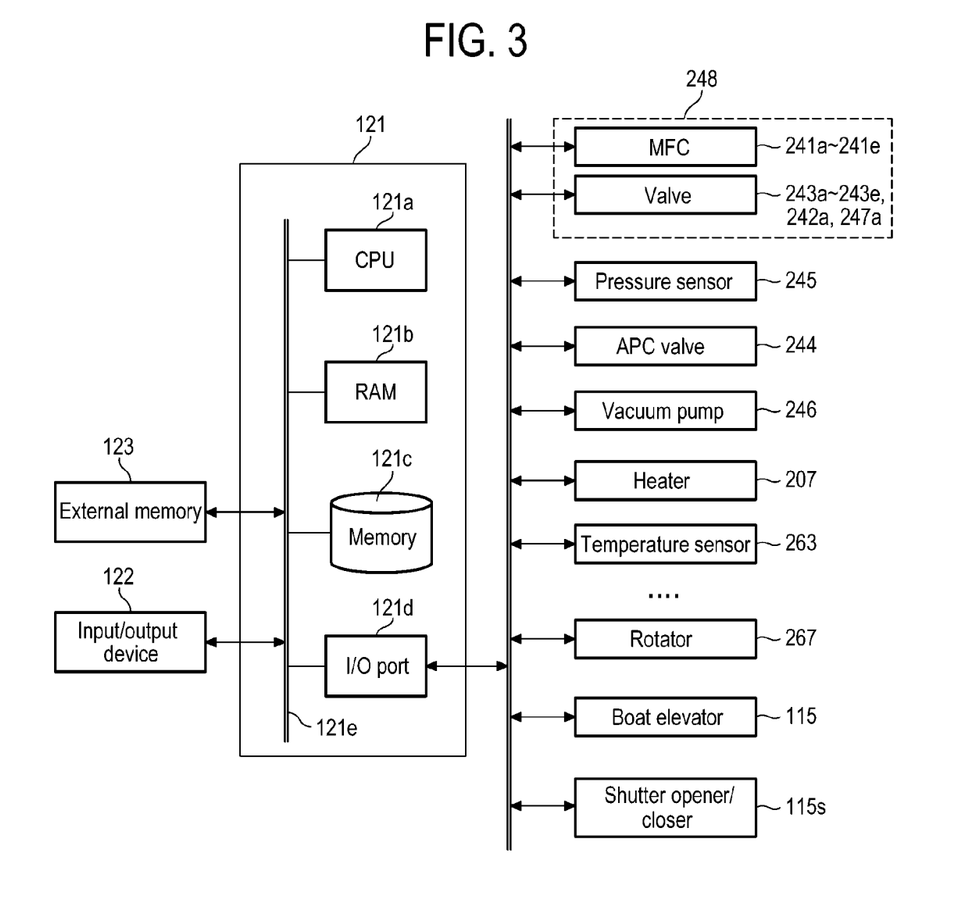
FIG. 3 is a schematic configuration diagram of a controller 121 of the substrate processing apparatus suitably used in one embodiment of the present disclosure, in which a control system of the controller 121 is illustrated in a block diagram.

As shown in FIG. 3, the controller 121 as a control part (control means) is configured as a computer including a CPU (Central Processing Unit) 121a, a RAM (Random Access Memory) 121b, a memory 121c and an I/O port 121d. The RAM 121b, the memory 121c and the I/O port 121d are configured to exchange data with the CPU 121a via an internal bus 121e. An input/output device 122 configured as, for example, a touch panel or the like is connected to the controller 121.

The memory 121c is composed of, for example, a flash memory, an HDD (Hard Disk Drive), an SSD (Solid State Drive), or the like. A control program for controlling the operation of the substrate processing apparatus, a process recipe in which procedures, conditions, or the like of substrate processing to be described below, or the like are readably stored in the memory 121c. The process recipe is a combination for causing the controller 121 to execute the respective procedures in a below-described substrate processing process so as to obtain a predetermined result. The process recipe functions as a program. Hereinafter, the process recipe, the control program and the like are collectively and simply referred to as a program. Furthermore, the process recipe is also simply referred to as a recipe. When the term "program" is used herein, it may mean a case of including only the recipe, a case of including only the control program, or a case of including both the recipe and the control program. The RAM 121b is configured as a memory area (work area) in which programs, data and the like read by the CPU 121a are temporarily held.

The I/O port 121d is connected to the MFCs 241a to 241e, the valves 243a, 242a, 247a and 243b to 243e, the pressure sensor 245, the APC valve 244, the vacuum pump 246, the temperature sensor 263, the heater 207, the rotator 267, the boat elevator 115, the shutter opener/closer 115s, and the like.

The CPU 121a is configured to read and execute the control program from the memory 121c and to read the recipe from the memory 121c in response to an input of an operation command from the input/output device 122 or the like. The CPU 121a is configured to be capable of control, according to the contents of the read recipe, the flow rate adjustment operation of various gases by the MFCs 241a to 241e, the opening/closing operations of the valves 243a, 242a, 247a and 243b to 243e, the opening/closing operation of the APC valve 244, the pressure regulation operation by the APC valve 244 based on the pressure sensor 245, the actuating and stopping of the vacuum pump 246, the temperature control operation of the heater 207 based on the temperature sensor 263, the rotation and the rotation speed adjustment operation of the boat 217 by the rotator 267, the raising or lowering operation of the boat 217 by the boat elevator 115, the opening/closing operation of the shutter 219s by the shutter opener/closer 115s, and the like.

The controller 121 may be configured by installing, in the computer, the above-described program stored in an external memory 123. The external memory 123 includes, for example, a magnetic disk such as an HDD or the like, an optical disk such as a CD or the like, a magneto-optical disk such as an MO or the like, a semiconductor memory such as a USB memory, an SSD or the like, and so forth. The memory 121c and the external memory 123 are configured as a computer readable recording medium. Hereinafter, the memory 121c and the external memory 123 are collectively and simply referred to as a recording medium. As used herein, the term "recording medium" may include only the memory 121c, only the external memory 123, or both. The provision of the program to the computer may be performed by using a communication means such as the Internet or a dedicated line without having to use the external memory 123.

(2) Substrate Processing Process

As a process of manufacturing a semiconductor device using the substrate processing apparatus described above, an example of a sequence in which a wafer 200 as a substrate is processed, i.e., an example of a film-forming sequence in which a film is formed on the wafer 200, will be described mainly with reference to FIG. 4. In the present embodiment, there will be described an example in which a silicon substrate (silicon wafer) having recesses such as trenches or holes provided on the surface of the wafer 200 is used as the wafer 200. In the following description, the operations of the respective parts constituting the substrate processing apparatus are controlled by the controller 121.

In the film-forming sequence according to the present embodiment, a film is formed on a wafer 200 by performing a cycle a predetermined number of times (n times where n is an integer of 1 or more), the cycle including:

Step A of supplying a precursor gas from the precursor gas supply line into the process chamber 201 in which the wafer 200 having the recess provided on a surface thereof is accommodated; and Step B of supplying a reaction gas into the process chamber 201 in which the wafer 200 is accommodated.

In the film-forming sequence according to the present embodiment, in step A, the precursor gas is divisionally supplied to the wafer 200 a plurality of times (m times where m is an integer of 2 or more). When the precursor gas is supplied for the first time, the precursor gas is pre-filled in the storage 240a installed in the precursor gas supply line and then supplied into the process chamber 201. The inside of the process chamber 201 is exhausted before one or more subsequent supply of the precursor gas after the first supply of the precursor gas. FIG. 4 shows a case where, for example, in step A, the precursor gas is divisionally and intermittently supplied to the wafer 200 three times (when m=3).

In the subject specification, the above-described film-forming sequence may be denoted as follows for the sake of convenience. The same notation is used in the following description of modifications or other embodiments.

(precursor gas×m→reaction gas)×n

Figure 4:
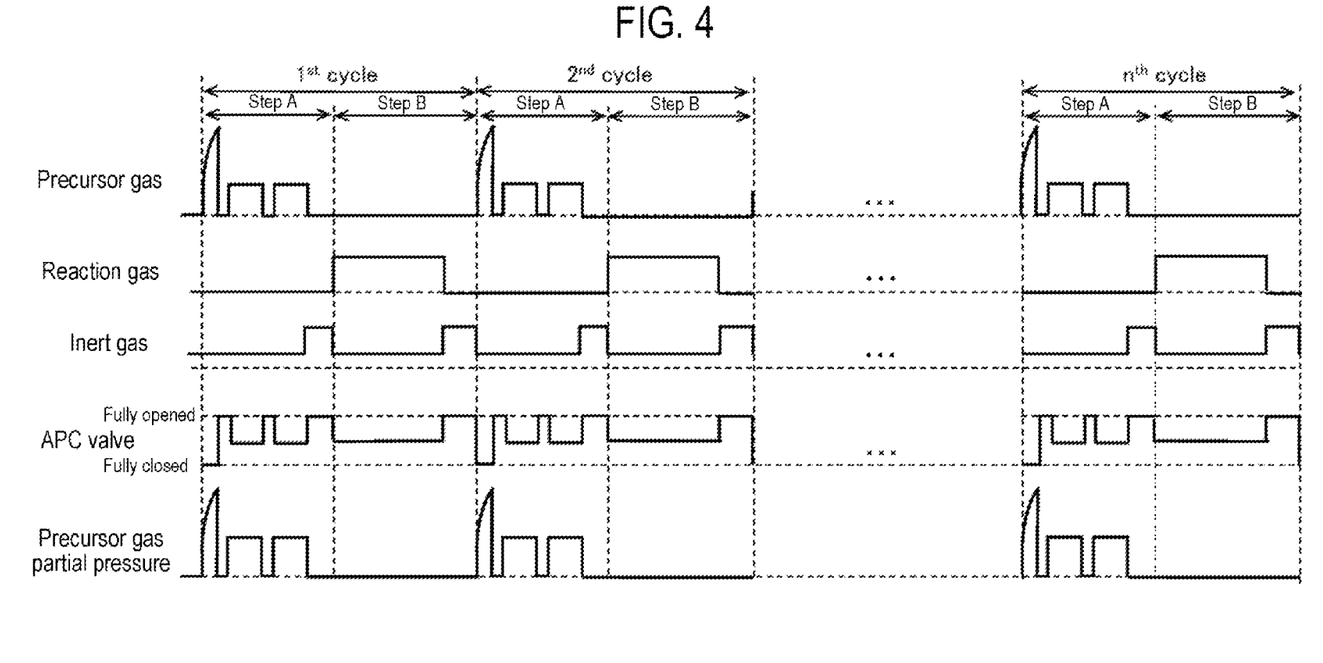
FIG. 4 is a flowchart showing a film-forming sequence according to one aspect of the present disclosure, showing supply timings of a precursor gas, a reaction gas and an inert gas, an opened/closed state of an APC valve 244 and a transition of a partial pressure of a precursor gas.

As shown in FIG. 4, when step A and step B are alternately performed n times (where n is an integer of 1 or more), a step of purging the inside of the process chamber 201 may be interposed between step A and step B. Further, as shown in FIG. 4, when the precursor gas is supplied intermittently divided in m times (where m is an integer of 1 or more), after supplying the precursor gas in the first to m−1th time, the gas or the like remaining in the process chamber 201 may be removed by exhausting without performing a step of purging the inside of the process chamber 201. The film-forming sequence in this case may be denoted as follows. Hereinafter, a term "purging" means that the precursor gas and intermediates existing in the process chamber 201 are removed by supplying an inert gas into the process chamber 201. A term "exhaust" means that the precursor gas and intermediates existing in the process chamber 201 are removed without supplying an inert gas into the process chamber 201. Further, the phrase "without supplying the inert gas" in the "exhaust" means that the purge gas is not supplied, but it also means that a carrier gas or a small amount of inert gas may be supplied.

[(precursor gas→exhausting)×(m−1)→precursor gas→purging→reaction gas→purging]×n

When the term "wafer" is used herein, it may refer to "a wafer itself" or "a laminated body of a wafer and a predetermined layer or film formed on the surface of the wafer." When the phrase "a surface of a wafer" is used herein, it may refer to "a surface of a wafer itself" or "a surface of a predetermined layer or the like formed on a wafer." When the expression "a predetermined layer is formed on a wafer" is used herein, it may mean that "a predetermined layer is directly formed on a surface of a wafer itself" or that "a predetermined layer is formed on a layer or the like formed on a wafer." When the term "substrate" is used herein, it may be synonymous with the term "wafer."

Wafer Charging and Boat Loading

After a plurality of wafers 200 is charged to the boat 217 (wafer charging), the shutter 219s is moved by the shutter opener/closer 115s to open the lower end opening of the manifold 209 (shutter opening). Thereafter, as shown in FIG. 1, the boat 217 supporting the plurality of wafers 200 is lifted by the boat elevator 115 and loaded into the process chamber 201 (boat loading). In this state, the seal cap 219 seals the lower end of the manifold 209 via the O-ring 220b.

Pressure Regulation and Temperature Control

After the boat loading is completed, the inside of the process chamber 201, i.e., a space where the wafer 200 exists, is vacuum-exhausted (decompression-exhausted) by the vacuum pump 246 so that the pressure inside the process chamber 201 becomes a desired pressure (vacuum degree). In this operation, a pressure inside the process chamber 201 is measured by the pressure sensor 245, and the APC valve 244 is feedback-controlled based on the measured pressure information (pressure regulation). Furthermore, the wafer 200 in the process chamber 201 is heated by the heater 207 to reach a desired processing temperature. In this operation, the degree of conducting electricity to the heater 207 is feedback-controlled based on the temperature information detected by the temperature sensor 263 so that the inside of the process chamber 201 has a desired temperature distribution (temperature control). Moreover, the rotation of the wafer 200 by the rotator 267 is started. The exhausting of the process chamber 201 and the heating and rotation of the wafer 200 are continuously performed at least until the processing on the wafer 200 is completed.

Film-Forming Process

Thereafter, the following steps A and B are sequentially performed.

Step A

In this step, the precursor gas is divisionally supplied to the wafer 200 in the process chamber 201 a plurality of times. Specifically, step a1 of supplying the precursor gas into the process chamber 201 and step a2 of exhausting the inside of the process chamber 201 are alternately repeated a plurality of times (m times where m is an integer of 2 or more).

Before the first step a1, the valves 242a and 247a are closed, and the valve 243a is opened to allow the precursor gas to flow into the gas supply pipe 232a. The flow rate of the precursor gas is adjusted by the MFC 241a, and the precursor gas is supplied into the storage 240a. As a result, the storage 240a is filled with the precursor gas. After the storage 240a is filled with a predetermined amount of precursor gas, the valve 243a is closed to maintain a state in which the storage 240a is filled with the precursor gas.

In the first step a1, the valves 247a and 242a are opened in the named order or at the same time, and the high-pressure precursor gas filled in the storage 240a is allowed to flow into the process chamber 201 at once. As a result, the precursor gas is supplied to the wafer 200 at once (flash supply of the precursor gas). In the flash supply, the precursor gas injected from the nozzle 249a into the process chamber 201 is accelerated to, for example, about the velocity of sound (340 m/sec) due to the pressure difference between the storage 240a and the process chamber 201. The velocity of the precursor gas on the wafer 200 reaches about several tens of m/sec. As shown in FIG. 4, a supply time in the flash supply may be shorter than a supply time in the non-flash supply in one or more subsequent steps a1 after the first step a1 described later. At this time, the valve 243a is left to be opened. At this time, the valves 243c to 243e may be opened to supply the inert gas into the process chamber 201 via the nozzles 249a to 249c, respectively. Further, as shown in FIG. 4, this step may be performed in a state that the exhaust system substantially fully closed (APC valve 244 substantially fully closed). Herein, the state "substantially closed (substantially fully closed)" includes a state in which the APC valve 244 is opened about 0.1 to several % or a state in which, even if the APC valve 244 is controlled to be closed by 100%, the gas is exhausted to the exhaust system due to the performance of the APC valve 244.

After the first step a1 and before the one or more subsequent steps a1, the valves 243a, 242a and 247a are closed. By closing the valves in this way, the precursor gas is prevented from being supplied into the storage 240a.

In the one or more subsequent steps a1 after the first step a1, the valves 243a, 242a and 247a are opened to allow the precursor gas to flow into the gas supply pipe 232a. The flow rate of the precursor gas is adjusted by the MFC 241a. The precursor gas is supplied into the process chamber 201 via the valve 243a, the storage 240a, the valve 242a, the valve 247a and the nozzle 249a. As a result, the precursor gas is supplied to the wafer 200 (non-flash supply of the precursor gas). In this step, the precursor gas may be supplied into the process chamber 201 without filling the storage 240a in advance. In this case, a velocity of the precursor gas on the wafer 200 is smaller than that in the case of the flash supply. At this time, the valves 243c to 243e may be opened to supply the inert gas into the process chamber 201 via the nozzles 249a to 249c, respectively. The one or more subsequent steps a1 after the first step a1 are performed not in a state that the APC valve 244 is fully closed which means, for example, the APC valve 244 is in a state between a fully-opened state and a fully-closed state, so that a pressure inside the process chamber 201 becomes a predetermined pressure.

In step a2, the valves 243a, 242a and 247a are closed to stop the supply of the precursor gas into the process chamber 201. Then, the APC valve 244 is fully opened, for example, to exhaust the inside of the process chamber 201, whereby the gas and the like remaining in the process chamber 201 are removed from the inside of the process chamber 201. As shown in FIG. 4, in a final step a2 among the steps a2 performed a plurality of times, the inert gas may be supplied into the process chamber 201 to purge the inside of the process chamber 201 with the inert gas (purging). As shown in FIG. 4, an execution time of executing the final step a2 among the steps a2 performed a plurality of times may be the longest. Further, a flow rate of the inert gas supplied into the process chamber 201 in a final step a2 among the steps a2 performed a plurality of times, may larger than the flow rate of the inert gas supplied in the other steps a2.

As the precursor gas, for example, when a chlorosilane gas described later is used, by alternately repeating steps a1 and a2 a predetermined number of times under the processing conditions described later and divisionally supplying the chlorosilane gas to the wafer 200 a plurality of times, a silicon (Si)-containing layer containing Cl and having a predetermined thickness is formed, as a first layer, on the outermost surface of the wafer 200 as a base. The Si-containing layer containing Cl is formed on the outermost surface of the wafer 200, by physical adsorption or chemical adsorption of molecules of the chlorosilane gas, by physical adsorption or chemical adsorption of molecules of a substance generated by a decomposition of a part of the chlorosilane gas, or by deposition of Si by thermal decomposition of the chlorosilane gas, or the like. The Si-containing layer containing Cl may be an adsorption layer (physical adsorption layer or chemical adsorption layer) of molecules of the chlorosilane gas or molecules of a substance generated by the decomposition of a part of the chlorosilane gas, or may be a deposition layer of Si containing Cl. When the above-mentioned chemical adsorption layer or the above-mentioned deposition layer is formed on the outermost surface of the wafer 200, Si contained in the chlorosilane gas is adsorbed on the outermost surface of the wafer 200. In the subject specification, the Si-containing layer containing Cl is also simply referred to as a Si-containing layer.

As the precursor gas, it may be possible to use, for example, a silane-based gas containing Si as a main element constituting the film formed on the wafer 200. As the silane-based gas, it may be possible to use, for example, a gas containing Si and halogen, i.e., a halosilane-based gas. Halogen includes chlorine (Cl), fluorine (F), bromine (Br), iodine (I) or the like. As the halosilane gas, it may be possible to use, for example, the chlorosilane gas containing Si and Cl.

As the precursor gas, it may be possible to use, for example, a chlorosilane gas such as a monochlorosilane ($SiH_3Cl$, abbreviated as MCS) gas, a dichlorosilane ($SiH_2Cl_2$, abbreviated as DCS) gas, a trichlorosilane ($SiHCl_3$, abbreviated as TCS) gas, a tetrachlorosilane ($SiCl_4$, abbreviated as STC) gas, a hexachlorodisilane gas ($Si_2Cl_6$, abbreviated as HCDS) gas, an octachlorotrisilane ($Si_3Cl_8$, abbreviated as OCTS) gas, or the like. One or more of the above-mentioned gases may be used as the precursor gas.

As the precursor gas, in addition to the chlorosilane gas, it may be possible to use, for example, a fluorosilane gas such as a tetrafluorosilane ($SiF_4$) gas, a difluorosilane ($SiH_2F_2$) gas or the like, a bromosilane gas such as a tetrabromosilane ($SiBr_4$) gas, a dibromosilane ($SiH_2Br_2$) gas or the like, and an iodosilane gas such as a tetraiodosilane ($SiI_4$) gas, a diiodosilane ($SiH_2I_2$) gas or the like. One or more of the above-mentioned gases may be used as the precursor gas.

As the precursor gas, in addition to these gases, it may be possible to use, for example, a gas containing Si and an amino group, i.e., an aminosilane gas. The amino group is a monovalent functional group obtained by removing hydrogen (H) from ammonia, a primary amine or a secondary amine, and may be represented as —$NH_2$, —NHR or —$NR_2$. In addition, R represents an alkyl group, and two Rs of —$NR_2$ may be the same or different.

As the precursor gas, it may be possible to use, for example, an aminosilane gas such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tertiary-butylamino)silane ($SiH_2[NH(C_4H_9)]_2$, abbreviation: BTBAS) gas, a (diisopropylamino)silane ($SiH_3[N(C_3H_7)_2]$, abbreviation: DIPAS) gas or the like. One or more of the above-mentioned gases may be used as the precursor gas.

As the inert gas, it may be possible to use, for example, a nitrogen ($N_2$) gas or a rare gas such as an argon (Ar) gas, a helium (He) gas, a neon (Ne) gas, a xenon (Xe) gas or the like. One or more of the above-mentioned gases may be used as the inert gas. This point is the same in each step described later.

Step B

After step A is completed, a reaction gas is supplied to the wafer 200 in the process chamber 201, i.e., the Si-containing layer as the first layer formed on the wafer 200.

Specifically, the valve 243b is opened to allow the reaction gas to flow into the gas supply pipe 232b. A flow rate of the reaction gas is adjusted by the MFC 241b. The reaction gas is supplied into the process chamber 201 via the nozzle 249b and is exhausted from the exhaust port 231a. At this time, the reaction gas is supplied to the wafer 200 (reaction gas supply). At this time, the valves 243c to 243e may be opened to supply the inert gas into the process chamber 201 via the nozzles 249a to 249c, respectively. In some of the methods described below, the supply of the inert gas into the process chamber 201 may not be performed.

As the reaction gas, for example, when a nitriding gas described later is used, by supplying the nitriding gas to the wafer 200 under the processing conditions described later, at least a part of the Si-containing layer formed on the wafer 200 is nitrided (modified). As a result, a silicon nitride layer (SiN layer) is formed on the outermost surface of the wafer 200 as a base as a second layer, which is a layer obtained by nitriding the Si-containing layer, i.e., a layer containing Si and N. When forming the SiN layer, impurities such as Cl and the like contained in the Si-containing layer form a gaseous substance containing at least Cl and are discharged from the inside of the process chamber 201 during the process of modifying the Si-containing layer with the nitriding gas. As a result, the SiN layer becomes a layer having fewer impurities such as Cl and the like than the Si-containing layer formed in step A.

After the SiN layer as the second layer is formed, the valve 243b is closed to stop the supply of the nitriding gas into the process chamber 201. Then, the gas or the like remaining in the process chamber 201 is removed from the process chamber 201 by the same processing procedure as in the purging in step A (purging).

As the reaction gas, it may be possible to use, for example, a nitrogen (N)- and hydrogen (H)-containing gas which is a nitriding gas (nitriding agent). The N- and H-containing gas is both an N-containing gas and an H-containing gas. The N- and H-containing gas may have an N—H bond.

As the reaction gas, it may be possible to use, for example, a hydrogen nitride-based gas such as an ammonia ($NH_3$) gas, a diazene ($N_2H_2$) gas, a hydrazine ($N_2H_4$) gas, an $N_3H_8$ gas or the like. One or more of the above-mentioned gases may be used as the reaction gas.

As the reaction gas, in addition to these gases, it may be possible to use, for example, a nitrogen (N)-, carbon (C)- and hydrogen (H)-containing gas. As the N-, C- and H-containing gas, it may be possible to use, for example, an amine-based gas or an organic hydrazine-based gas. The N, C and H-containing gas is also an N-containing gas, a C-containing gas, an H-containing gas, and an N- and C-containing gas.

As the reaction gas, it may be possible to use, for example, an ethylamine-based gas such as a monoethylamine ($C_2H_5NH_2$, abbreviation: MEA) gas, a diethylamine (($C_2H_5)_2NH$, abbreviation: DEA) gas, a triethylamine (($C_2H_5)_3N$, abbreviation: TEA) gas or the like, a methylamine-based gas such as a monomethylamine ($CH_3NH_2$, abbreviation: MMA) gas, a dimethylamine (($CH_3)_2NH$, abbreviation: DMA) gas, a trimethylamine (($CH_3)_3N$, abbreviation: TMA) gas or the like, an organic hydrazine-based gas such as a monomethylhydrazine (($CH_3)HN_2H_2$, abbreviation: MMH) gas, a dimethylhydrazine (($CH_3)_2N_2H_2$, abbreviation: DMH) gas, a trimethylhydrazine (($CH_3)_2N_2(CH_3)H$, abbreviation: TMH) gas, and so forth. One or more of the above-mentioned gases may be used as the reaction gas.

Performing a Predetermined Number of Times

By performing the cycle including the above-described steps A and B a predetermined number of times (n times where n is an integer of 1 or more), for example, a silicon nitride film (SiN film) can be formed as a film on the surface of the wafer 200. The above cycle may be repeated a plurality of times. That is, the thickness of the SiN layer formed per cycle is set to be thinner than a desired film thickness, and the above cycle may be repeated a plurality of times until the thickness of the SiN film formed by laminating the SiN layers becomes equal to the desired film thickness. At this time, in step A, the amount of the precursor gas pre-filled in the storage 240a may be set to a constant amount for each cycle. Further, in the one or more subsequent cycles after the first cycle, the filling of the storage 240a with the precursor gas in step A may be performed in parallel with the supplying of the reaction gas in step B one cycle before. When an N-, C- and H-containing gas is used as the reaction gas, for example, a silicon carbonitride layer (SiCN layer) can be formed as the second layer, and for example, a silicon carbonitride film (SiCN film) can be formed as a film on the surface of the wafer 200 by performing the above cycle a predetermined number of times.

The following are examples of the processing conditions in each of the above-described steps when, for example, the chlorosilane gas is used as the precursor gas and, for example, an N- and H-containing gas is used as the reaction gas. The notation of a numerical range such as "1 to 100 Pa" in the subject specification means that the lower limit value and the upper limit value are included in the range. Therefore, for example, "1 to 100 Pa" means "1 Pa or more and 100 Pa or less". The same applies to other numerical ranges. In addition, the processing temperature in the subject specification means the temperature of the wafer 200, and the processing pressure means the pressure in the process chamber 201.

The processing conditions when performing step a1 for the first time in step A are exemplified as follows.

Chlorosilane gas supply flow rate: 1 to 5000 sccm, specifically 100 to 5000 sccm Chlorosilane gas supply duration: 0.1 to 20 seconds, specifically 0.5 to 5 seconds Inert gas supply flow rate: 0 to 30,000 sccm, specifically 500 to 20,000 sccm Processing temperature: 250 to 800 degrees C., specifically 600 to 700 degrees C.

Processing pressure: 1 to 2666 Pa, specifically 1 to 1333 Pa

Chlorosilane gas partial pressure: 0.00005 to 3999 Pa, specifically 0.06 to 1333 Pa The processing conditions when performing step a1 for the one or more subsequent times after the first time in step A are exemplified as follows.

Chlorosilane gas supply flow rate: 1 to 2000 sccm, specifically 10 to 1000 sccm

Chlorosilane gas supply duration: 5 to 40 seconds, specifically 10 to 30 seconds Inert gas supply flow rate: 0 to 20000 sccm, specifically 500 to 10000 sccm Processing pressure: 1 to 2666 Pa, specifically 67 to 1333 Pa Chlorosilane gas partial pressure: 0.00005 to 2666 Pa, specifically 0.06 to 899 Pa Other processing conditions may be the same processing conditions as those when performing step a1 for the first time in step A.

The processing conditions when performing step a2 for the first to m−1th time in step A are exemplified as follows.

Inert gas supply flow rate: 1000 to 20000 sccm

Inert gas supply duration: 1 to 20 seconds, specifically 1 to 10 seconds

Other processing conditions may be the same processing conditions as those when performing step a1 for the first time in step A.

The processing conditions when performing step a2 for the last (mth) time in step A are exemplified as follows.

Inert gas supply flow rate: 1000 to 30000 sccm

Inert gas supply duration: 1 to 60 seconds, specifically 1 to 10 seconds

Other processing conditions may be the same processing conditions as those when performing step a1 for the first time in step A.

When step a2 is performed for the last (mth) time in step A, the supply of the inert gas into the process chamber 201 and the exhausting of the process chamber 201 in a state in which the supplying of the inert gas into the process chamber 201 is stopped may be repeated a plurality of times. That is, when step a2 is performed for the last (mth) time in step A, cycle purging may be performed.

The processing conditions in step B are exemplified as follows.

N- and H-containing gas supply flow rate: 1 to 20000 sccm, specifically 1000 to 10000 sccm N- and H-containing gas supply duration: 1 to 120 seconds, specifically 1 to 60 seconds Inert gas supply flow rate: 0 to 20000 sccm, specifically 500 to 10000 sccm Processing pressure: 1 to 4000 Pa, specifically 1 to 3000 Pa Other processing conditions may be the same processing conditions as those when performing step a1 for the first time in step A.

After-Purging and Atmospheric Pressure Restoration

After the film having a desired thickness is formed on the wafer 200, an inert gas as a purge gas is supplied into the process chamber 201 from each of the nozzles 249a to 249c and is exhausted from the exhaust port 231a. As a result, the inside of the process chamber 201 is purged, and the gas, reaction by-products, or the like remaining in the process chamber 201 are removed from the inside of the process chamber 201 (after-purging). Thereafter, the atmosphere in the process chamber 201 is replaced with the inert gas (inert gas replacement), and the pressure in the process chamber 201 is restored to the atmospheric pressure (atmospheric pressure restoration).

Boat Unloading and Wafer Discharging

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat is unloaded, the shutter 219s is moved and the lower end opening of the manifold 209 is sealed by the shutter 219s via the O-ring 220c (shutter closing). The processed wafers 200 are discharged out of the boat 217 after being unloaded from the reaction tube 203 (wafer discharging).

(3) Effects of the Present Embodiment

According to the present embodiment, one or more of the following effects may be obtained.

(a) In step A, the precursor gas is divisionally supplied to the wafer 200 a plurality of times. When the precursor gas is supplied for the first time, the precursor gas is pre-filled in the storage 240a installed in the precursor gas supply line and then supplied into the process chamber 201. Then, the inside of the process chamber 201 is exhausted before the one or more subsequent supply of the precursor gas after the first supply of the precursor gas. This makes it possible to improve the step coverage and the in-plane film thickness uniformity of the film formed on the wafer 200.

This is because the precursor gas is supplied into the heated process chamber 201 and then decomposed to generate various intermediates. For example, as the precursor gas is decomposed, there are generated a first intermediate (e.g., $SiCl_2$ when the precursor gas is an HCDS gas) having a plurality of dangling bonds, a second intermediate (e.g., $SiCl_4$ when the precursor gas is an HCDS gas) having one dangling bond or no dangling bond, or the like. Then, these intermediates are supplied to the surface of the wafer 200.

In this regard, the first intermediate has a plurality of dangling bonds. Therefore, the first intermediate has a characteristic that it is more easily adsorbed on the surface of the wafer 200, i.e., a characteristic that a time required for the adsorption reaction of the first intermediate on the surface of the wafer 200 is shorter, when compared with the second intermediate having one dangling bond or no dangling bond. Further, the first intermediate having a plurality of dangling bonds has a characteristic that it can leave dangling bonds on the surface of the wafer 200 after being adsorbed on the surface of the wafer 200 and has a difficulty in inhibiting subsequent additional adsorption of intermediates or the like on the surface of the wafer 200.

On the other hand, the second intermediate has a small number of dangling bonds or does not have dangling bonds. Therefore, the second intermediate has a characteristic that it is less likely to be adsorbed on the surface of the wafer 200 than the first intermediate having a plurality of dangling bonds, i.e., a characteristic that a time required for the adsorption reaction of the second intermediate on the surface of the wafer 200 is longer than that of the first intermediate. Further, the second intermediate having no multiple dangling bonds has a characteristic that it has a difficulty in leaving dangling bonds on the surface of the wafer 200 after being adsorbed on the surface of the wafer 200 and easily inhibits subsequent additional adsorption of intermediates or the like on the surface of the wafer 200.

Due to the characteristics of the first intermediate and the second intermediate, the first intermediate is preferentially adsorbed on the surface of the wafer 200. However, when the amount of the first intermediate is insufficient, the second intermediate is adsorbed on the wafer 200 and thereby the subsequent adsorption of the first intermediate is suppressed. As a result, the first intermediate cannot be uniformly adsorbed over the entire surface of the wafer 200. In addition, when processing the wafer 200 having unevenness formed thereon, the first intermediate cannot be uniformly adsorbed over the entire area of the initial adsorption site on the surface in the recess. That is, it becomes a factor of deterioration of step coverage.

Such intermediates can be generated if it is a material that decomposes at the processing temperature. For example, the intermediates can be generated if it is the material of the above-described precursor gas. Particularly, if the gas contains halogen, the same result can occur. Specifically, MCS, DCS, TCS, STC and OCTS may be used besides HCDS.

Figure 5A:
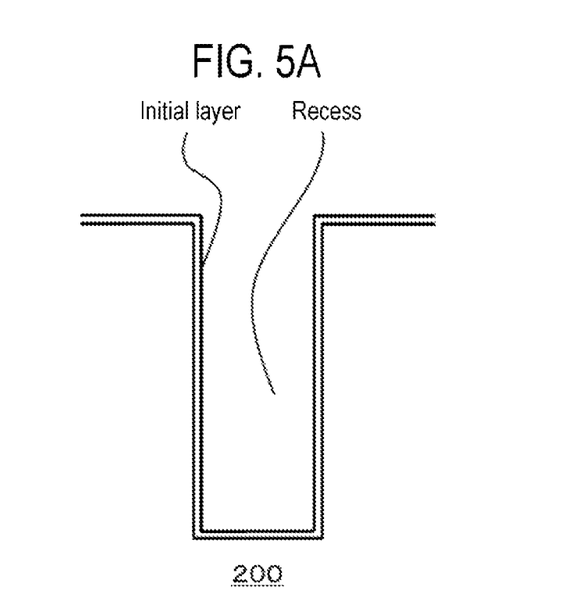
FIG. 5A is an enlarged sectional view of the surface of a wafer 200 after an initial layer is formed in a recess in an initial stage of step A of a film-forming sequence according to one aspect of the present disclosure.

In step A, the precursor gas is divisionally supplied to the wafer 200 a plurality of times. When the precursor gas is supplied for the first time, the precursor gas is pre-filled in the storage 240a installed in the precursor gas supply line and then supplied into the process chamber 201. That is, a large amount of precursor gas is supplied at once (flash supply) in a very short time. In this case, a large amount of the first intermediate can be supplied to the surface of the wafer 200 as compared with a case where the precursor gas is supplied into the process chamber 201 without being pre-filled in the storage 240a (non-flash supply). As a result, the first intermediate can be uniformly adsorbed over the entire surface of the wafer 200. In this way, at an initial stage of supplying the precursor gas, the first intermediate can be uniformly adsorbed over the entire area of an initial adsorption site on the outermost surface of the recess. As a result, as shown in FIG. 5A, a Si-containing layer having a uniform thickness over the entire area of the recess, i.e., a Si-containing layer having high step coverage, can be formed as an initial layer on the outermost surface of the recess. This layer may be a continuous layer or a discontinuous layer. In any case, the layer has high step coverage.

Figure 5B:
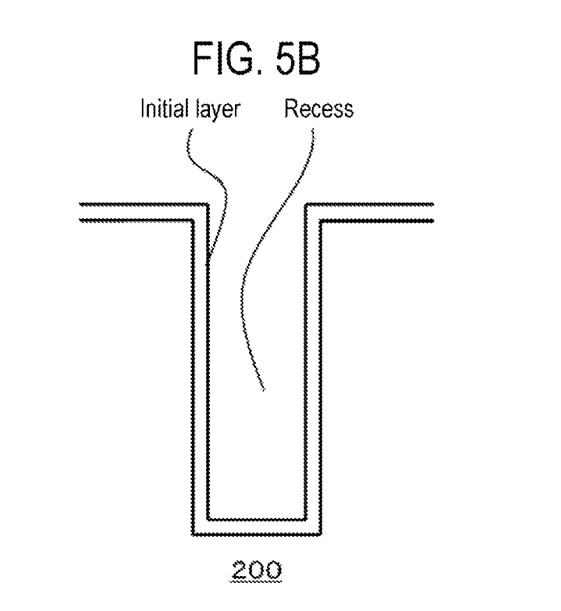
FIG. 5B is an enlarged sectional view of the surface of a wafer 200 after a first layer is formed in a recess in step A of a film-forming sequence according to one aspect of the present disclosure.

Further, by exhausting the inside of the process chamber 201 before the one or more subsequent supplying of the precursor gas after the first supplying of the precursor gas as in the present embodiment, the second intermediate generated in the process chamber 201 due to the supply of the precursor gas can be discharged to the outside of the process chamber 201 before being adsorbed on the surface of the wafer 200, and can be prevented from adsorbing on the surface of the wafer 200. As a result, as shown in FIG. 5B, it is possible to form a uniform and conformal first layer (Si-containing layer) over the entire area in the recess provided on the surface of the wafer 200.

As a result, it is possible to improve the step coverage and the in-plane film thickness uniformity of the film formed on the substrate.

(b) In step A, when the precursor gas is supplied for the first time, an amount of the precursor gas pre-filled in the storage 240a may be equal to or greater than an amount of the precursor gas required to adsorb the first intermediate over the entire surface of the wafer 200. Thus, the first intermediate can be uniformly adsorbed over the entire surface of the wafer 200, and the adsorption of the second intermediate on the surface of the wafer 200 can be suppressed. As a result, it is possible to improve the step coverage and the in-plane film thickness uniformity of the film formed on the wafer 200.

(c) In step A, an amount of the precursor gas pre-filled in the storage 240a is set to a constant amount for each of the cycle. This makes it possible to make uniform the thickness of the film formed on the wafer 200 per cycle, i.e., the cycle rate. As a result, it is possible to improve the controllability of the thickness of the film formed on the wafer 200.

(d) In step A, when the precursor gas is supplied for the first time, the pressure in the process chamber 201 may be set to a pressure (predetermined pressure) equal to or greater than a pressure required to allow the first intermediate to be adsorbed over the entire surface of the wafer 200. Thus, the first intermediate can be uniformly adsorbed over the entire surface of the wafer 200, and the adsorption of the second intermediate on the surface of the wafer 200 can be suppressed. As a result, it is possible to improve the step coverage and the in-plane film thickness uniformity of the film formed on the wafer 200.

(e) In step A, when the precursor gas is supplied for the first time, after a pressure in the process chamber 201 reaches a predetermined pressure, the supplying of the precursor gas into the process chamber 201 may be terminated and the exhausting of the process chamber 201 may be started. Thus, a time in which the pressure in the process chamber 201 is relatively high can be shortened, and the adsorption of the second intermediate on the surface of the wafer 200 can be suppressed. As a result, it is possible to improve the step coverage and the in-plane film thickness uniformity of the film formed on the wafer 200.

(f) In step A, a supply time of the precursor gas when the precursor gas is supplied for the first time is set to be shorter than a supply time of the precursor gas when the precursor gas is supplied for the one or more subsequent times after the first time. This makes it possible to suppress the adsorption of the second intermediate on the surface of the wafer 200. As a result, it is possible to improve the step coverage and the in-plane film thickness uniformity of the film formed on the wafer 200.

(g) In step A, when the precursor gas is supplied for the first time, the precursor gas is supplied into the process chamber 201 in a state in which the exhaust system that exhausts the atmosphere in the process chamber 201 is substantially closed, i.e., a state in which the exhaust system is substantially fully closed. Thus, the pressure in the process chamber 201 can be quickly increased to a predetermined pressure required for allowing the first intermediate to be adsorbed over the entire surface of the wafer 200 in a short time. This makes it possible to shorten the cycle time and improve the productivity of the film-forming process.

(h) In step A, when the precursor gas is supplied for the one or more subsequent times after the first time, the precursor gas is supplied into the process chamber 201 without being filled in the storage 240a in advance (non-flash supply). Thus, it is not necessary to fill the precursor gas into the storage 240a in the one or more subsequent supply of the precursor gas after the first supply of the precursor gas. Therefore, a waiting time according to the filling of the precursor gas can be reduced as compared with a case where the precursor gas is filled into the storage 240a each time the precursor gas is supplied. As a result, it is possible to shorten the cycle time and improve the productivity of the film-forming process. In addition, the precursor gas stored during supplying the precursor gas for the first time can be suppressed from remaining in the storage 240a. As a result, it is possible to suppress the generation of particles in the storage 240a. For example, if the precursor gas stored when the precursor gas is supplied for the first time continues to remain in the storage 240a, particles may be generated due to decomposition, aggregation, etc. of the precursor gas. By not filling the precursor gas into the storage 240a when the precursor gas is supplied for one or more subsequent times after the first time, it is possible to suppress the precursor gas from remaining in the storage 240a.

(i) In step A, the supplying of the precursor gas when the precursor gas is supplied for one or more subsequent times after the first time may be terminated before the adsorption of the precursor gas on the wafer 200 reaches a saturated state. This makes it possible to suppress the adsorption of the second intermediate on the surface of the wafer 200 and to leave dangling bonds on the surface of the wafer 200. As a result, the subsequent adsorption of intermediates or the like on the surface of the wafer 200 is not inhibited, and the deterioration of the step coverage or the in-plane film thickness uniformity of the film formed on the wafer 200 can be avoided.

When supplying the precursor gas for one or more subsequent times after the first time, if the supply of the precursor gas is continued until the adsorption of the precursor gas on the wafer 200 reaches a saturated state, the second intermediate is adsorbed on the surface of the wafer 200, which makes it difficult to leave dangling bonds on the surface of the wafer 200. As a result, the subsequent adsorption of additional intermediates or the like on the surface of the wafer 200 may be inhibited, which may deteriorate the step coverage or the in-plane film thickness uniformity of the film formed on the wafer 200.

(j) In the one or more subsequent cycles after the first cycle, the filling of the precursor gas into the storage 240a in step A is performed in parallel with step B. By doing so, it is possible to shorten the cycle time and improve the productivity of the film-forming process as compared with the case where the filling of the precursor gas into the storage 240a is performed not parallel with step B. The same effect can be obtained when the filling of the precursor gas into the storage 240a in the first cycle is performed before starting the film-forming process, for example, during performing the pressure regulation and temperature control described above.

(k) In step A, step a1 of supplying the precursor gas into the process chamber 201 and step a2 of exhausting the inside of the process chamber 201 are alternately repeated a plurality of times, whereby the second intermediates, particles or the like generated in the process chamber 201 can be discharged to the outside of the process chamber 201 before being adsorbed on the surface of the wafer 200. As a result, it is possible to improve the step coverage, the in-plane film thickness uniformity and the film quality of the film formed on the wafer.

(l) In step A, the inert gas is supplied into the process chamber 201 when step a2 of exhausting the inside of the process chamber 201 is performed for the last (mth) time. Thus, the undecomposed precursor gas or the like can be reliably discharged from the process chamber 201 before the reaction gas is supplied in step B, and the generation of particles in the process chamber 201 can be reliably suppressed. As a result, it is possible to improve the film quality of the film formed on the wafer 200. When the inert gas is allowed to flow in all the plurality of steps a2 as shown in FIG. 4, the above-mentioned effect can be surely achieved by maximizing the flow rate of the inert gas when step a2 is performed for the last time.

In step A, when step a2 of exhausting the inside of the process chamber 201 is performed for the first to m−1th time, the gas or the like remaining in the process chamber 201 are removed only by exhausting without supplying the inert gas into the process chamber 201. The adsorption on the wafer 200 of the precursor gas supplied in the second to mth steps a1, particularly the adsorption in the recess of the wafer 200 can be prevented from being suppressed by the inert gas. As a result, it is possible to improve the film quality of the film formed on the wafer 200. Further, it is possible to prevent the exhaust of the precursor gas supplied in step a1 from being suppressed by the inert gas. That is, it is possible to reduce the possibility that the second intermediate among the intermediates generated by the decomposition or the like of the precursor gas supplied in step a1 is adsorbed on the wafer 200. As a result, it is possible to improve the film quality of the film formed on the wafer 200. Particularly, the gas and the like remaining in the process chamber 201 may be removed only by exhausting without supplying the inert gas into the process chamber 201 during the first step a2.

(m) In step A, the execution time when step a2 of exhausting the inside of the process chamber 201 is performed for the last time is the longest. Thus, the undecomposed precursor gas and the like can be reliably discharged from the process chamber 201 before the reaction gas is supplied in step B, and the generation of particles in the process chamber 201 can be reliably suppressed. As a result, it is possible to improve the film quality of the film formed on the wafer 200.

(n) When filling the precursor gas into the storage 240a, particles may be generated at a place where the pressure is high. By installing the valves 243a, 242a and 247a as described above and performing the filling of the precursor gas into the storage 240a while opening the valve 243a and closing the valve 242a, it is possible to suppress the generation of particles in the valve 247a. That is, it is possible to space the place of particle generation far away from the process chamber. As a result, it is possible to improve the film quality of the film formed on the wafer 200.

Further, when the supplying of the precursor gas filled in the storage 240a into the process chamber 201 is performed by opening the valve 242a in a state that the valve 247a is opened, it is possible to suppress the generation of particles in the valve 247a. That is, it is possible that the place of particle generation is far away from the process chamber.

In step A, for example, as shown in FIG. 4, a partial pressure of the precursor gas in the first step a1 is set to be higher than a partial pressure of the precursor gas in the one or more subsequent steps a1 after the first step a1. Since a large amount of precursor gas is flash-supplied in the first step a1, a large amount of the first intermediate can be supplied to the surface of the wafer 200 as compared with the non-flash supply in the one or more subsequent steps a1 after the first step a1. As a result, the first intermediate can be uniformly adsorbed over the entire surface of the wafer 200.

(o) The above-mentioned effects can be similarly obtained when using the above-mentioned various precursor gases, the above-mentioned reaction gases and the above-mentioned various inert gases. The above-mentioned effects can be remarkably obtained when a halosilane gas is used as the precursor gas. Further, the above-mentioned effects can be particularly remarkably obtained when a chlorosilane gas is used as the precursor gas.

Other Embodiments of the Present Disclosure

The embodiment of the present disclosure has been specifically described above. However, the present disclosure is not limited to the above-described embodiment, and various modifications may be made without departing from the gist thereof.

In the above-described embodiment, there has been described the case where, when the precursor gas is supplied for the first time in step A, the precursor gas is supplied into the process chamber 201 in a state in which the exhaust system for exhausting the atmosphere in the process chamber 201 is fully closed. However, the present disclosure is not limited thereto. For example, when the precursor gas is supplied for the first time in step A, the precursor gas may be supplied into the process chamber 201 in a state in which the exhaust system for exhausting the atmosphere in the process chamber 201 is fully opened. By doing so, it is possible to prevent the pressure in the process chamber 201 from rising excessively, suppress the generation of particles due to the aggregation, decomposition, etc. of the precursor gas, and improve the film quality of the film formed on the wafer 200. Further, it is possible to shorten the time required for exhausting the inside of the process chamber 201 after the supply of the precursor gas is stopped, and improve the productivity of the film-forming process. Further, for example, when the precursor gas is supplied for the first time in step A, the valve opening degree of the APC valve 244 provided in the exhaust system for exhausting the atmosphere in the process chamber 201 may be set to a state between a fully-opened state and a fully-closed state. Specifically, the valve opening degree may be 0.1% to 99.9%, specifically about 50% to 80%. Thus, the exhaust system that exhausts the atmosphere in the process chamber 201 can be set to a state between a fully-opened state and a fully-closed state. As a result, the above-mentioned effects available when the exhaust system is fully closed and the above-mentioned effects available when the exhaust system is fully opened can be obtained in a well-balanced manner.

Further, in the above-described embodiment, there has been described the case where, as shown in FIG. 4, when the precursor gas is divisionally and intermittently m times (where m is an integer of 1 or more), after the precursor gas is supplied for the first to m–1th time, the gas or the like remaining in the process chamber 201 may be removed only by exhausting without performing the step of purging the inside of the process chamber 201. However, the present disclosure is not limited thereto. For example, when the precursor gas is divisionally and intermittently m times (where m is an integer of 1 or more), after the precursor gas is supplied for the first to m–1th time, the inert gas may be supplied into the process chamber 201 to perform the step of purging the inside of the process chamber 201. The film-forming sequence in this case may be denoted as follows.

[(precursor gas→purging)×($m$–1)→precursor gas→purging→reaction gas→purging]×$n$ Further, for example, when the precursor gas is divisionally and intermittently m times (where m is an integer of 1 or more), after the precursor gas is supplied in the first to m–1th time, the process chamber 201 may be exhausted and then the inert gas may be supplied into the process chamber 201 to perform the step of purging the inside of the process chamber 201. The film-forming sequence in this case may be denoted as follows.

[(precursor gas→exhausting→purging)×($m$–1)→precursor gas→purging→reaction gas→purging]×$n$ Further, in the final a2 in step A, exhausting and purging may be performed in combination. The film-forming sequence in this case may be denoted as follows.

[(precursor gas→exhausting→purging)×($m$–1)→precursor gas→exhausting→purging→reaction gas→purging]×$n$ After the precursor gas is supplied for the first to m–1th time, step A may be performed as the step A in the film-forming sequence of the above-described embodiment. That is, after the supply of the precursor gas, one or both of exhausting and purging may be performed.

Further, after supplying the reaction gas in step B, exhausting and purging may be performed in combination. The film-forming sequence in this case may be denoted as follows.

[(precursor gas→purging)×($m$–1)→precursor gas→purging→reaction gas→exhausting→purging]—$n$ Step A may be performed as the step A in the film-forming sequence of the above-described embodiment. That is, after the supply of the precursor gas, one or both of exhausting and purging may be performed.

Further, in the above-described embodiment, there has been described the case where, in the one or more subsequent cycles after the first cycle, the filling of the precursor gas into the storage 240a in step A is performed in parallel with step B. However, the present disclosure is not limited thereto. For example, in the one or more subsequent cycles after the first cycle, the filling of the precursor gas into the storage 240a may be started after the final supplying of the precursor gas in step A and before the supplying of the reaction gas in step B. By doing so, it is possible to further shorten the cycle time and further improve the productivity of the film-forming process.

Further, in the above-described embodiment, the chlorosilane gas has been described as an example of the precursor gas. However, the present disclosure is not limited thereto. For example, the present disclosure may be applied to a case where, by using a precursor gas containing a metal element such as aluminum (Al), titanium (Ti), hafnium (Hf), zirconium (Zr), tantalum (Ta), molybdenum (Mo), tungsten (W) or the like, a film containing a metal element, such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN), a tungsten nitride film (WN), an aluminum oxide film (AlO film), a titanium oxide film (TiO film), a hafnium oxide film (HfO film), a zirconium oxide film (ZrO film), a tantalum oxide film (TaO film), a molybdenum oxide film (MoO), a tungsten oxide film (WO), a titanium oxynitride film (TiON film), a titanium aluminum carbonitride film (TiAlCN film), a titanium aluminum carbide film (TiAlC film), a titanium carbon dioxide film (TiCN) or the like, is formed on a substrate by the above-described film-forming sequence. Even in these cases, at least a part of the effects described in the above-described embodiment may be obtained.

Moreover, in the above-described embodiment, for example, the N- and H-containing gas has been described as an example of the reaction gas. However, the present disclosure is not limited thereto. For example, a carbon (C)-containing gas such as an ethylene ($C_2H_4$) gas, an acetylene ($C_2H_2$) gas, a propylene ($C_3H_6$) gas or the like, a boron (B)-containing gas such as a diborane ($B_2H_6$) gas, a trichloroborane ($BCl_3$) gas or the like, and an oxygen (O)-containing gas such as an oxygen ($O_2$) gas, an ozone ($O_3$) gas, a plasma-excited $O_2$ gas ($O_2$*), $O_2$ gas+hydrogen ($H_2$) gas, a water vapor ($H_2O$ gas), a hydrogen peroxide ($H_2O_2$) gas, a nitrous oxide ($N_2O$) gas, a nitrogen monoxide (NO) gas, a nitrogen dioxide ($NO_2$) gas, a carbon monoxide (CO) gas, a carbon dioxide ($CO_2$) gas or the like may be used. In the subject specification, the parallel notation of two gases such as "$O_2$ gas+$H_2$ gas" means a mixed gas of a $H_2$ gas and an $O_2$ gas. When supplying a mixed gas, two gases may be mixed (premixed) in a supply pipe and then supplied into the process chamber 201, or two gases may be supplied separately from different supply pipes into the process chamber 201 and mixed (post-mixed) in the process chamber 201. As the reaction gas, one or more of the above-mentioned gases may be used. Even in these cases, at least a part of the effects described in the above-described embodiment may be obtained.

Further, in the above-described embodiment, there has been described the case where the SiN film or the SiCN film is formed on the wafer 200 in the substrate processing process. However, the present disclosure is not limited thereto. The present disclosure may also be applied a case where, in addition to the SiN film or the SiCN film, for example, a film containing Si, such as a silicon oxynitride film (SiON film), a silicon oxycarbide film (SiOC film), a silicon oxycarbonitride film (SiOCN film), a silicon borocarbonitride film (SiBCN film), a silicon boronitride film (SiBN film), a silicon oxide film (SiO film) or the like is formed. Even in these cases, at least a part of the effects described in the above-described embodiment may be obtained.

The recipe used for each process may be prepared separately according to the processing contents and may be stored in the memory 121c via an electric communication line or an external memory 123. When starting each process, the CPU 121a may properly selects an appropriate recipe from a plurality of recipes stored in the memory 121c according to the contents of the process. This makes it possible to form films of various film types, composition ratios, film qualities and film thicknesses with high reproducibility in one substrate processing apparatus. In addition, the burden on an operator can be reduced, and each process can be quickly started while avoiding operation errors.

The above-described recipes are not limited to the newly prepared ones, but may be prepared by, for example, changing the existing recipes already installed in the substrate processing apparatus. In the case of changing the recipes, the recipes after the change may be installed in the substrate processing apparatus via an electric communication line or a recording medium in which the recipes are recorded. In addition, the input/output device 122 provided in the existing substrate processing apparatus may be operated to directly change the existing recipes already installed in the substrate processing apparatus.

In the above-described embodiment, there has been described an example in which a film is formed using a batch type substrate processing apparatus for processing a plurality of substrates at a time. The present disclosure is not limited to the above-described embodiment, but may be suitably applied to, for example, a case where a film is formed using a single-wafer type substrate processing apparatus for processing one or several substrates at a time. Furthermore, in the above-described embodiment, there has been described an example in which a film is formed using a substrate processing apparatus having a hot wall type process furnace. The present disclosure is not limited to the above-described embodiment but may also be suitably applied to a case where a film is formed using a substrate processing apparatus having a cold wall type process furnace.

Even in the case of using these substrate processing apparatuses, each process may be performed under the same processing procedures and processing conditions as those used in the above-described embodiment and modifications, and the same effects as those of the above-described embodiment and modifications may be obtained.

The above-described embodiment and modifications may be used in combination as appropriate. The processing procedures and processing conditions at this time may be the same as, for example, the processing procedures and processing conditions of the above-described embodiment or modifications.

According to the present disclosure in some embodiments, it is possible to provide a technique capable of improving the step coverage or the in-plane film thickness uniformity of the film formed on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing method, comprising:
   forming a film on a substrate by performing a cycle a predetermined number of times, the cycle including:
   (a) supplying a precursor gas from a precursor gas supply line into a process chamber in which the substrate is accommodated;
   (b) supplying a reaction gas into the process chamber; and
   (c) supplying an inert gas into the process chamber between (a) and (b), wherein in (a), the precursor gas is divisionally supplied to the substrate a first plural number of times, wherein in (a), the precursor gas is pre-filled in a storage installed in the precursor gas supply line and then supplied into the process chamber when the precursor gas is supplied for the first time, wherein (a) further comprises exhausting an inside of the process chamber before supplying the precursor gas for the second time, wherein in (a), the exhausting is performed without supplying the inert gas or with supplying a smaller amount of the inert gas than an amount of the inert gas supplied in (c) into the process chamber, and wherein in (a), a supply time of the precursor gas when the precursor gas is supplied for the first time is set to be shorter than a supply time of the precursor gas when the precursor gas is supplied for the second time.

2. The method of claim 1, wherein in the process chamber, the precursor gas is decomposed into a first intermediate having at least a plurality of dangling bonds and a second intermediate having one dangling bond or no dangling bond, and wherein in (a), an amount of the precursor gas pre-filled in the storage when the precursor gas is supplied for the first time is set to be equal to or greater than an amount of the precursor gas required to adsorb the first intermediate over a surface of the substrate.

3. The method of claim 1, wherein the cycle is performed two or more times, and wherein in (a), an amount of the precursor gas pre-filled in the storage when the precursor gas is supplied for the first time is set to a constant amount for each cycle.

4. The method of claim 1, wherein in the process chamber, the precursor gas is decomposed into a first intermediate having at least a plurality of dangling bonds and a second intermediate having one dangling bond or no dangling bond, and wherein in (a), a pressure inside the process chamber when the precursor gas is supplied for the first time is set to be equal to or greater than a pressure required to adsorb the first intermediate over a surface of the substrate.

5. The method of claim 1, wherein in (a), after a pressure in the process chamber reaches a predetermined pressure, the supplying of the precursor gas into the process chamber is terminated and the exhausting of the inside of the process chamber is started.

6. The method of claim 1, wherein in (a), when the precursor gas is supplied for the first time, the precursor gas is supplied into the process chamber in a state in which an exhaust system that exhausts an atmosphere in the process chamber is fully closed.

7. The method of claim 1, wherein in (a), when the precursor gas is supplied for the first time, the precursor gas is supplied into the process chamber in a state in which an exhaust system that exhausts an atmosphere in the process chamber is fully opened.

8. The method of claim 1, wherein in (a), when the precursor gas is supplied for the first time, an exhaust system that exhausts an atmosphere in the process chamber is in a state between a fully-opened state and a fully-closed state.

9. The method of claim 1, wherein in (a), when the precursor gas is supplied for the second time, the precursor gas is supplied into the process chamber without additionally pre-filling the precursor gas in the storage.

10. The method of claim 1, wherein in (a), the supplying of the precursor gas when the precursor gas is supplied for the second time is terminated before an adsorption of the precursor gas on the substrate reaches a saturated state.

11. The method of claim 1, in the process chamber, the precursor gas is decomposed into a first intermediate having at least a plurality of dangling bonds and a second intermediate having one dangling bond or no dangling bond, and wherein the supplying of the precursor gas when the precursor gas is supplied for the second time is terminated after the first intermediate is adsorbed on the substrate and before the second intermediate is adsorbed on the substrate.

12. The method of claim 1, wherein the cycle is performed twice or more, and wherein in the cycle for the second time, filling of the precursor gas in the storage is performed in parallel with the supplying of the reaction gas in (b).

13. The method of claim 1, wherein the cycle is performed twice or more, and wherein in the cycle for the second time, filling of the precursor gas in the storage is started after supplying of the precursor gas in (a) for the final time among the first plural number of times, and before the supplying of the reaction gas in (b).

14. The method of claim 1, wherein in (a), the act of supplying the precursor gas into the process chamber and the act of exhausting the inside of the process chamber are alternately repeated a second plural number of times.

15. The method of claim 14, wherein in (a), an inert gas is supplied into the process chamber when the act of exhausting the inside of the process chamber is performed for the final time among the second plural number of times.

16. The method of claim 14, wherein in (a), an execution time of performing the act of exhausting the inside of the process chamber for the final time among the second plural number of times is set to be longest among performing the act of exhausting the inside of the process chamber the second plural number of times.

17. The method of claim 1, wherein the precursor gas supply line includes:

a first valve provided on an upstream side of the storage in a gas flow;

a second valve provided on a downstream side of the storage in the gas flow, which is on a side closer to the process chamber; and a third valve provided on a downstream side of the second valve in the gas flow and in the vicinity of the process chamber, wherein the precursor gas is filled into the storage in a state in which the first valve is opened and the second valve is closed, and wherein the precursor gas filled in the storage is supplied to the process chamber by opening the second valve in a state in which the third valve is opened.

18. A method of manufacturing a semiconductor device, comprising:

providing a substrate; and performing the method of claim 1.

19. A non-transitory computer-readable recording medium storing a program that causes, by a computer, a substrate processing apparatus to perform the according to claim 1.

20. A substrate processing apparatus configured to perform the method of claim 1, comprising:

the process chamber in which the substrate is processed;

the precursor gas supply line configured to supply the precursor gas to the substrate;

the storage installed in the precursor gas supply line to store the precursor gas;
a reaction gas supply line configured to supply the reaction gas to the substrate;
an inert gas supply line configured to supply the inert gas to the substrate; and
a controller configured to be capable of controlling the precursor gas supply line, the reaction gas supply line, and the inert gas supply line.

* * * * *